(12) United States Patent
Hodrinsky et al.

(10) Patent No.: US 9,023,672 B2
(45) Date of Patent: May 5, 2015

(54) LIGHT EMITTING SYSTEMS AND METHODS

(71) Applicant: Liteideas, LLC, Mansfield Center, CT (US)

(72) Inventors: Todd Hodrinsky, Mansfield Center, CT (US); Donald T. Wesson, Jr., Ashford, CT (US); Deborah D. Cebry, Burlington, CT (US); Matthew D. Gidman, Willin, CT (US); Robert M. Sarazin, Marlborough, CT (US)

(*) Notice: Subject to any disclaimer, the term of this patent is extended or adjusted under 35 U.S.C. 154(b) by 0 days.

(21) Appl. No.: 13/743,887

(22) Filed: Jan. 17, 2013

(65) Prior Publication Data

US 2013/0181237 A1  Jul. 18, 2013

Related U.S. Application Data

(60) Provisional application No. 61/587,891, filed on Jan. 18, 2012.

(51) Int. Cl.
| | | |
|---|---|---|
| H01L 33/08 | (2010.01) | |
| H01L 33/52 | (2010.01) | |
| H01L 27/15 | (2006.01) | |
| H01L 33/54 | (2010.01) | |
| H01L 25/075 | (2006.01) | |
| F21K 99/00 | (2010.01) | |
| F21Y 101/02 | (2006.01) | |

(52) U.S. Cl.
CPC ............... H01L 33/52 (2013.01); H01L 33/08 (2013.01); H01L 27/15 (2013.01); H01L 25/0753 (2013.01); H01L 33/54 (2013.01); H01L 2933/005 (2013.01); F21K 9/90 (2013.01); F21Y 2101/02 (2013.01); H01L 2924/0002 (2013.01)

(58) Field of Classification Search
None
See application file for complete search history.

(56) References Cited

U.S. PATENT DOCUMENTS

| | | | | |
|---|---|---|---|---|
| 7,385,228 B2* | 6/2008 | Saito et al. | | 257/98 |
| 7,642,108 B2* | 1/2010 | Krames et al. | | 438/22 |
| 2007/0090387 A1* | 4/2007 | Daniels et al. | | 257/99 |
| 2011/0316032 A1* | 12/2011 | Ooyabu et al. | | 257/98 |
| 2012/0165759 A1* | 6/2012 | Rogers et al. | | 604/264 |

* cited by examiner

*Primary Examiner* — Johannes P Mondt
(74) *Attorney, Agent, or Firm* — Law Office of Ilya Libenzon (57) ABSTRACT

A light emitting system and related method are disclosed.

12 Claims, 6 Drawing Sheets

LIGHT EMITTING SYSTEMS AND METHODS

RELATED APPLICATION DATA

This application claims the priority of prior U.S. provisional application Ser. No. 61/587,891 filed on Jan. 18, 2012, which is hereby incorporated by reference herein in its entirety.

TECHNICAL FIELD

The invention relates to light-emitting systems and related methods.

BACKGROUND ART

A light emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

A common approach to preparing an LED is as follows. The layers of material are prepared in the form of a wafer. Typically, the layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Then the LED chips are packaged. Currently employed packaging methods utilize wire bonding, soldering, metal bumps, as well as ultrasonic thermal bonding using silver, tin, and gold bumps, for example. An array of LED devices can form a printed circuit board assembly (PCB assembly). These PCB assemblies are costly to design and are not environmentally friendly. Fabricating such packaging structures is a complicated and costly process. These prior art packaging schemes are not reliable because solder in general and lead free solders in particular are prone to premature failure due to lack of pliability, as well as due to residual stress and deformation during thermal processing.

SUMMARY OF THE EMBODIMENTS

It is therefore an object of the present invention to provide an LED package and related method that result in such a package that is characterized by high reliability.

It is further object of the present invention to provide an LED package and related method that is easy to fabricate and that replaces a PCB assembly.

It is yet further object of the present invention to provide an LED package that is environmentally friendly and less expensive than the prior art packages.

The invention features a light-emitting system. A light-emitting system comprises at least one light-emitting device, the at least one light-emitting device comprising a p-doped region, an n-doped region, an active region disposed between the p-doped region and n-doped region, an n-contact layer disposed on the n-doped layer and a p-contact layer disposed on the p-doped layer; wherein at least one light-emitting device is being encapsulated in an encapsulant layer such that the top side and bottom side of the light-emitting device is exposed (not being encapsulated); and conductive patterns formed on the encapsulant layer forming a circuit for connecting to a power source for operating at least one light-emitting device, the formed circuit being in electrical communication with the n-contact layer and p-contact layer of the light-emitting device; wherein at least one light-emitting device is selected from the group consisting of a light-emitting diode, surface mount device (SMD) package incorporating at least one light-emitting diode, integrated circuit incorporating at least one light-emitting diode, or a combination thereof.

In one set of embodiments, the p-contact layer and the n-contact layer of the light-emitting device are disposed on the same side of the light-emitting device, on the side that is opposite the light emission surface of the light-emitting device.

In one instance, the p-contact layer and the n-contact layer of the light-emitting device are disposed on the opposite sides of the light-emitting device.

In another instance, the light-emitting system further comprises a transparent encapsulation layer.

In one variant, the light-emitting system further comprises a light converting phosphor layer.

In another variant, the light-emitting system further comprising a carrier layer with conductive patterns disposed thereon being in electrical communication with the n-contact layer and p-contact layer of the light-emitting device.

In one example, the light-emitting system features via holes that are formed in the encapsulation layer.

In another example, the light-emitting system further comprising a conductive, transparent layer disposed on the emission side of the light-emitting device.

In another example, at least one light-emitting device encapsulated in an encapsulant layer is being further formed on top of the first encapsulant layer.

A method of making a light-emitting system is also disclosed. The method comprises the steps of a) providing at least one light-emitting device comprising a p-doped region, an n-doped region, an active region disposed between the p-doped region and n-doped region, an n-contact layer disposed on the n-doped layer and a p-contact layer disposed on the p-doped layer; b) providing a first non-flexible support layer; c) placing a first flexible layer on the surface of the non-flexible support layer; d) placing the at least one light-emitting device on the surface of the flexible layer; e) placing a shim frame on the surface of the flexible layer (on the perimeter of the flexible layer); wherein the shim height is being about equal to the height of the at least one light-emitting device; f) placing a second flexible layer; g) placing a second non-flexible support layer; h) clamping the layers with clamps in at least two places around the perimeter of these layers; i) injecting an encapsulant material into the cavity formed between the first and the second flexible layers; j) curing the encapsulant material; k) removing the clamps; l) removing the second non-flexible support layer; m) removing the second flexible layer; n) removing the first non-flexible support layer; o) removing the first flexible layer; p) optionally, removing the shim frame; and q) forming conductive patterns on the encapsulant layer forming a circuit for connecting to a power source for operating the at least one light-emitting device, the formed circuit being in electrical communication with the n-contact layer and p-contact layer of the light-emitting device; wherein the at least one light-emitting device is selected from the group consisting of light-emitting diode, surface mount device (SMD) package incorporating at least one light-emitting diode, integrated circuit incorporating at least one light-emitting diode, or a combination thereof.

In one instance, the p-contact layer and the n-contact layer are disposed on the same side of the light-emitting device, on the side that is opposite the light emission surface of the light-emitting device.

In another instance, the p-contact layer and the n-contact layer are disposed on the opposite sides of the light-emitting device.

And yet in another instance, the method further comprising the step of encapsulating at least one of a top side and bottom side of the light-emitting device with the encapsulant by performing steps e) through k), m), o), and p) as disclosed above.

In one example, the method further comprises disposing a light converting phosphor layer.

In another example, at least one of the first and second non-flexible support layers have at least one protrusion, the protrusion having the height being about equal to the height of the light-emitting device.

In yet another example, at least one of the first and second non-flexible support layer having at least one protrusion with the height that is not equal to the height of the light-emitting device.

In one instance, the first and second non-flexible support layers each has at least one recess, the recesses forming an opening when aligned with each other after the layers are clamped together in step h) as disclosed above.

In another instance, the shim frame has at least one discontinuity.

In one example, the method further comprising placing at least one light-emitting device and a shim frame on the surface of the cured encapsulant layer, wherein the shim height is being about equal to the height of the at least one light-emitting device; and then conducting steps f) through k), m), o), and p) as disclosed above.

In another example, either the first flexible layer or the first non-flexible support layer is used but not both and wherein conductive patterns are formed on the first flexible layer or the first non-flexible support layer, wherein placing at least one light-emitting device on the surface of the flexible layer as in step d) such that at least one of the p-contact layer and n-contact layer is being in direct contact with the conductive patterns; and wherein the patterns forming a circuit for connecting to a power source for operating at least one light-emitting device, the formed circuit being in electrical communication with the n-contact layer and p-contact layer of the light-emitting device.

And yet in another example, either the first flexible layer or the first non-flexible support layer is used but not both, wherein either the second flexible layer or the second non-flexible support layer is used but not both, and wherein conductive patterns are formed on the second flexible layer or the second non-flexible support layer, wherein placing one of these layers as in step f) or g) such that at least one of the p-contact layer and n-contact layer is being in direct contact with the conductive patterns; and wherein the patterns forming a circuit for connecting to a power source for operating the at least one light-emitting device, the formed circuit being in electrical communication with the n-contact layer and p-contact layer of the light-emitting device; and wherein the first non-flexible support layer or the first flexible layer is a transparent layer, conductive layer, or transparent and conductive layer.

Other aspects, embodiments and features of the invention will become apparent from the following detailed description of the invention when considered in conjunction with the accompanying figures. The accompanying figures are for schematic purposes and are not intended to be drawn to scale. In the figures, each identical or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention.

BRIEF DESCRIPTION OF THE DRAWINGS

The preceding summary, as well as the following detailed description of the invention, will be better understood when read in conjunction with the attached drawings. For the purpose of illustrating the invention, presently preferred embodiments are shown in the drawings. It should be understood, however, that the invention is not limited to the precise arrangements and instrumentalities shown.

DETAILED DESCRIPTION OF SPECIFIC EMBODIMENTS

Figure 1:
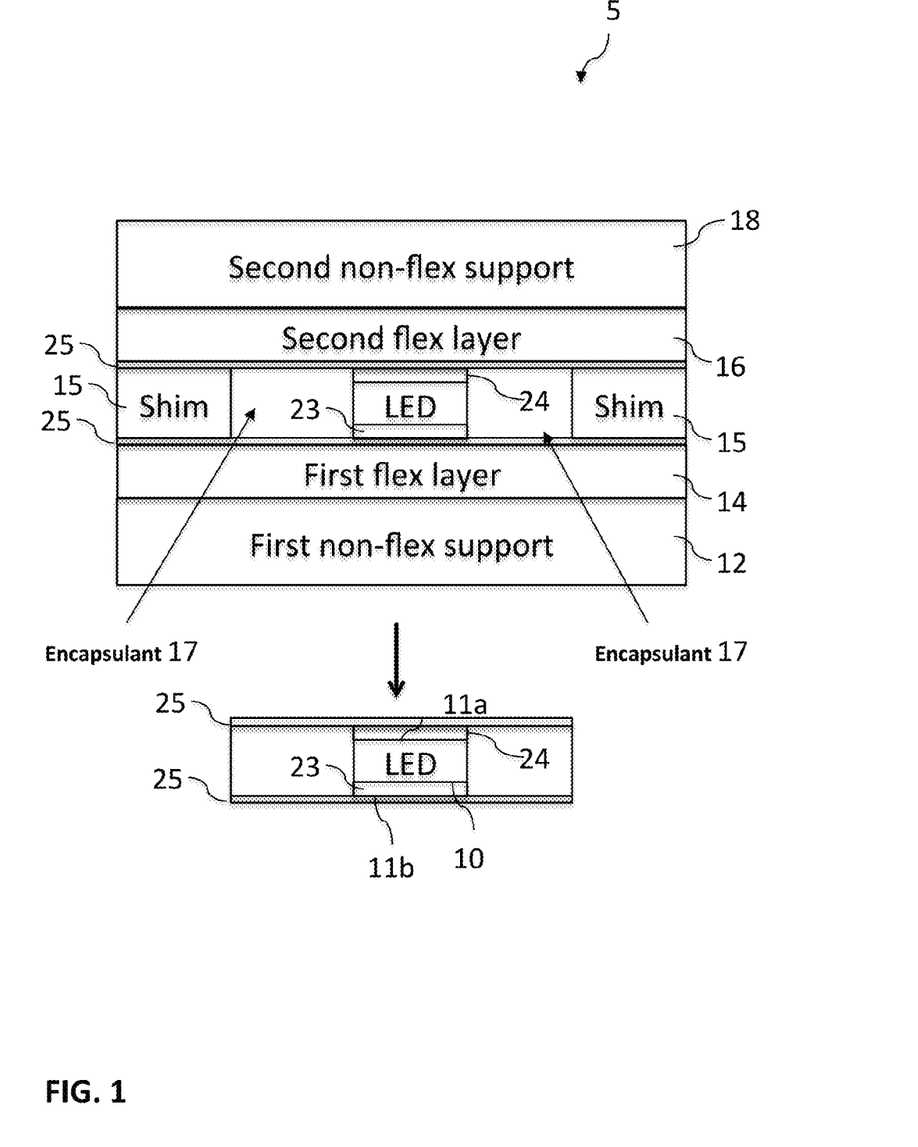
FIG. 1 is a schematic cross-section of a light-emitting system and method of its fabrication in accordance with one preferred embodiment of the present invention.

One embodiment of the present invention features a light-emitting system and method of its fabrication illustrated in FIG. 1. A light-emitting system 5 includes at least one light-emitting device 10, the at least one light-emitting device 10 comprising a p-doped region, an n-doped region, an active region disposed between the p-doped region and n-doped region, an n-contact layer 23 disposed on the n-doped layer and a p-contact layer disposed on the p-doped layer 24; wherein the at least one light-emitting device 10 is encapsulated in an encapsulant layer 17 such that the top side 11a and bottom side 11b of the light-emitting device 10 is substantially devoid of the encapsulant 17; and conductive patterns 25 formed on the encapsulant layer 17 forming a circuit for connecting to a power source for operating at least one light-emitting device 10, the formed circuit being in electrical communication with the n-contact layer 23 and p-contact layer 24 of the light-emitting device 10.

According to the present invention, the light-emitting system 5 comprises at least one light-emitting device 10 (it can comprise two light-emitting devices, three light-emitting devices, or more light-emitting devices, thus it can comprise an array of light-emitting devices with more than one light-emitting device).

The light-emitting system according to the present invention can further comprise a transparent encapsulation layer. It can also comprise a phosphor layer for light conversion purposes. It can also further comprise a lens for light collimation purposes, or for any other suitable purposes. The lens can be made from any suitable materials such as acrylic, PET, silicone or the like.

The conductive pattern/circuit of the carrier is connected to a DC or AC power source. Being in electrical communication with p-contact and n-contact of light-emitting device, the circuit functions as a means for controlling the light-emitting device, or devices of the light-emitting system (p-contact is held at a positive potential relative to n-contact, which causes electrical current to be injected into LED, as the electrical current passes through light-generating region, electrons from n-doped layer combine with holes from p-doped layer, which causes the light-generating region to generate light). The conductive pattern on the carrier can be made of conductive materials such as silver, ITO, copper, gold, platinum, or any other suitable conductive materials.

According to the present invention, the light-emitting device 10 can be a light-emitting diode, or surface mount device (SMD), or an integrated circuit (IC), or combination thereof.

In accordance with the present invention, the light-emitting device can be a vertically aligned device, a device having a p-contact layer and n-contact layer being disposed on the opposite sides of the light-emitting device. Conversely, the n-contact layer can be disposed on the top side (the side from which the light is emitted) of the light-emitting device and the p-contact layer is being disposed on the opposite (bottom) side of the light-emitting device.

FIG. 1 also illustrates the method of making a light-emitting system 5. A first non-flexible support layer 12 is covered with a first flexible layer 14, then a light-emitting device 10 is placed on the surface of the first flexible layer 14, and a shim frame 15 is placed on the surface of the flexible layer 14 (on the perimeter of the flexible layer 14). The height of the shim frame 15 is being about equal to the height of the light-emitting device 10. Then second flexible layer 16 is placed on top of the shim frame 15 as shown in FIG. 1, and second non-flexible support layer 18 is placed on top of the flexible layer 16. The layers are clamped together with clamps (such as clamps 22 shown in FIG. 3) in at least two places, followed by the injection of encapsulant 17 into the cavity formed between the first flexible layer 14 and the second flexible layer 16. The injection of the encapsulant 17 is conducted by means of syringe or similar dispensing device. The encapsulant 17 is then cured. Depending on the type of an encapsulant material chosen, it can be cured by application of temperature, UV light, sunlight, or any other similar means. After the encapsulant 17 has been cured, the second non-flexible support layer 18 and second flexible layer 16 are removed by pealing them off. The shim frame 15 can be optionally removed as well. It could be pealed off, or cut off around the perimeter with a cutting device such as a razor, knife, or similar cutting devices. Then the first non-flexible support layer 12 and first flexible layer 14 are removed and conductive patterns are formed on the encapsulant 17 to create a circuit in electrical communication with the n-contact layer and p-contact layer of the light-emitting device for connecting to a AC or DC power source. The shim frame 15 could be made of metal, plastic, or any other suitable material. The shim frame 15 could be optionally not removed and left in tact permanently. If not removed, the shim frame 15 could be used as a connector or part of the lead for connecting the circuit formed by the conductive patterns to a power source, providing the shim frame 15 is made of conductive material. As a result of the described above process, the top side 11a and bottom side 11b of the light-emitting device 10 are substantially devoid of encapsulant 17. Because top side 11a and bottom side 11b are exposed, i.e. not encapsulated, it allows for formation of conductive patterns being in electrical communication with the p-contact and n-contact of the light-emitting device 10.

The light-emitting device 10 can be placed on the carrier manually, or using pick-and-place robotic systems, or by any other suitable methods. The conductive pattern/circuitry on the carrier can be formed by application of a conductive coating, a conductive ink, or a conductive adhesive, using a printing method such as inkjet printing method, a laser printing method, a silk-screen printing method, and a base sheet printing method, or any other suitable similar method.

The non-flexible support layer can be made of copper, glass, steel, plastic, or other metals or rigid materials that are suitable for forming a non-flexible support layer.

The flexible layer can be made of PET, PSA, or PMMA. It can be coated or sprayed on the non-flexible support layer. Both the flexible layer and non-flexible layer are formulated to transmit UV light, when a UV-curable encapsulant is used.

The encapsulant 17 can be chosen from temperature curable or UV-curable silicones, polyurethanes, epoxies, cyanoacrylates and acrylics, or mixture thereof. It can be formulated to have different hardness, to stick or not stick to flexible layer and to non-flexible support layer, or be thermally moldable. When an encapsulant is formulated not to stick to flexible layer, it functions as a release layer to provide for ease of removal of non-flexible support layer along with flexible layer.

Figure 2:
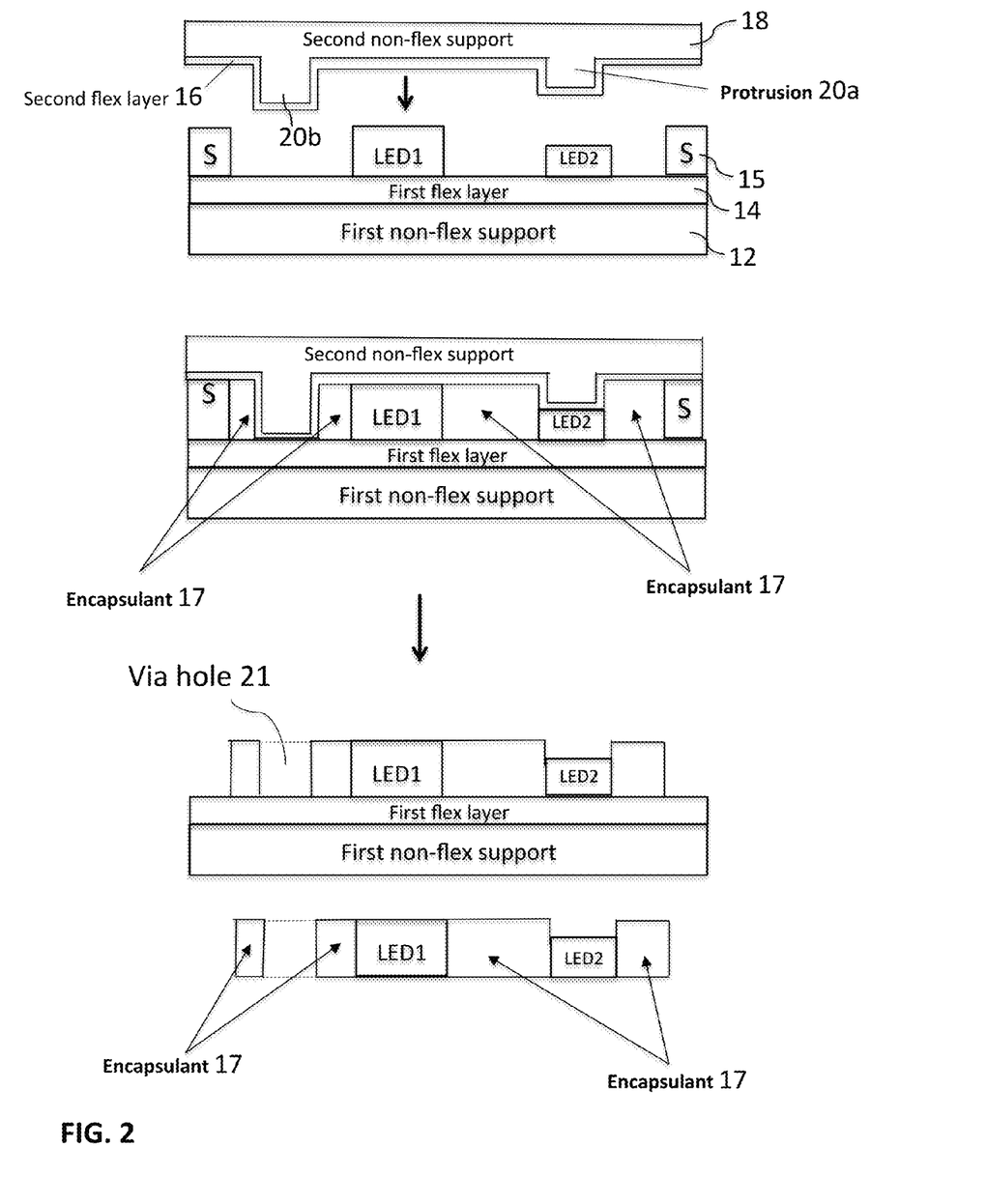
FIG. 2 is a schematic cross-section of a light-emitting system and method of its fabrication in accordance with one embodiment of the present invention.

To provide for encapsulating light-emitting devices of different height, a non-flexible support layer 18 with protrusions is used as shown in FIG. 2. If, for example, the height of LED2 is lower than that of LED1, then the non-flexible support layer 18 with protrusion 20a having the height equal to the difference between the height of the LED1 (or the shim frame 15) and the LED2 is utilized in the process resulting in the top surface of LED2 being exposed (not encapsulated) as shown in FIG. 2. The protrusions (such as protrusion 20b) having height equal to the shim frame 15 (or LED1) are used in the process to create via holes 21 for electrically connecting p-contact or n-contact of the light-emitting device 10 to a conductive patterns/circuitry (not shown). The first non-flexible support layer 12 can have protrusions as well. After formation, the via holes 21 can be metallized by depositing metal (using thin film deposition technique such as sputtering or evaporation), or by flow form method (wherein melted metal is flown into via holes), or by inserting a metal contact into the vias. The via holes 21 can be metallized before removal of the first non-flexible support layer 12 and first flexible layer 14, or after these removal steps have been carried out.

The described-above encapsulation steps can be repeated to form additional encapsulation layers on the top, or bottom, or both sides of the light-emitting system. For example, a shim frame can be placed on the top side and then a flexible layer and non-flexible support layer are placed thereon as well, followed by injecting an encapsulant into the cavity and curing the encapsulant, and then removing the non-flexible support layer along with the flexible layer. The thickness of the encapsulation layer is determined by the thickness of the shim frame. This process can be applied to both sides of the light-emitting system. The phosphor layer to convert the light and a lens can be disposed on the emission side of the light-emitting device.

Figure 3:
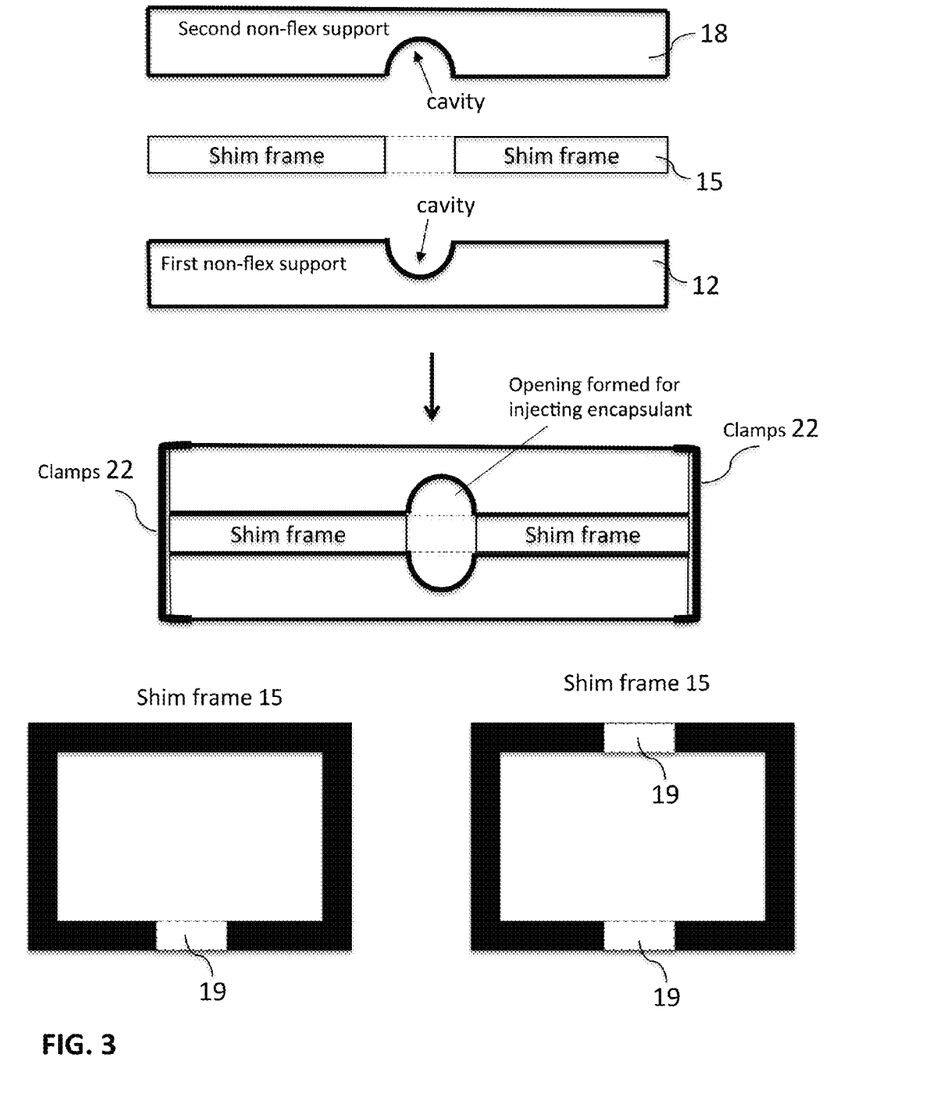
FIG. 3 is a schematic cross-section illustrating formation of an opening for injecting an encapsulant in accordance with another preferred method of the present invention.

For ease of injection of an encapsulant material, cavities in the non-flexible support layers (12, 18) are formed as shown in FIG. 3 to form an opening for injecting an encapsulant through the opening. A shim frame 15 can have at least one discontinuity 19 such that when layers aligned and clamped together (with clamps 22) even bigger opening is formed. There can be more than one opening formed using this approach.

Figure 4:
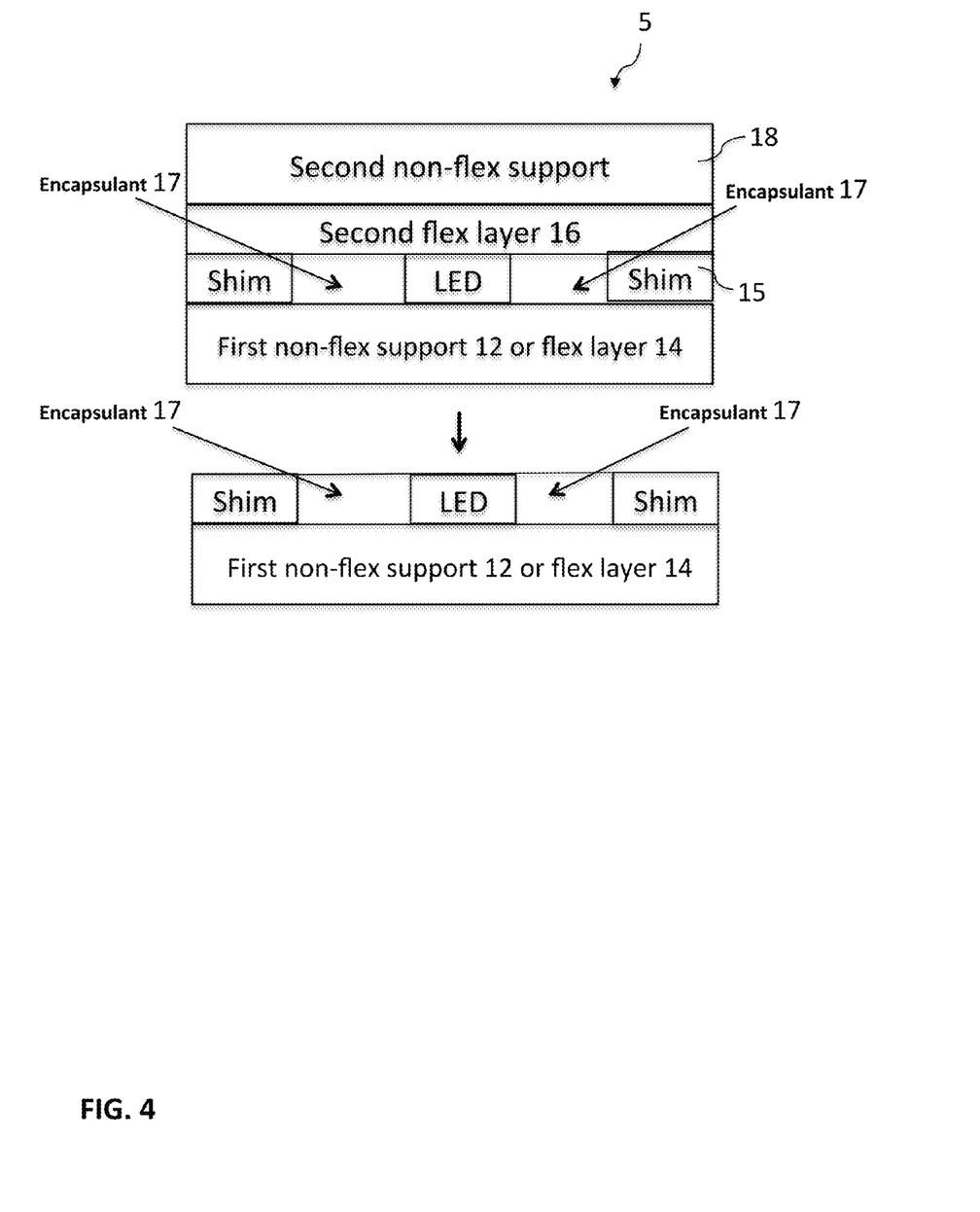
FIG. 4 illustrates a method of fabricating a light-emitting system in accordance with one embodiment of the present invention.

FIG. 4 illustrates a light-emitting system 5 fabricated in accordance with another method of the present invention. A light-emitting device (LED) is placed on a first layer that is either a non-flexible support layer 12 or a flexible layer 14. The conductive patterns (not shown) are pre-formed on these layers. The light-emitting device (LED) is placed on one of these layers such that at least one of the p-contact layer and n-contact layer is being placed in direct contact with the conductive patterns; so the patterns forming a circuit for connecting to a power source for operating the light-emitting device 10. The light-emitting device can be optionally attached with the non-conductive adhesive 24 as further shown in FIG. 5. Then the shim frame 15 is placed, followed by placing another flexible layer 16 and non-flexible support layer 18 as shown in FIG. 4. An encapsulant 17 is injected into the cavity and cured using light or temperature curing process. Then the top non-flexible support layer 18 along with top flexible layer 16 is removed. The shim frame 15 can be removed as well, or optionally can be left in tact and could be used as a lead or part of a lead to connect the formed circuitry to the AC or DC power source.

Figure 5:
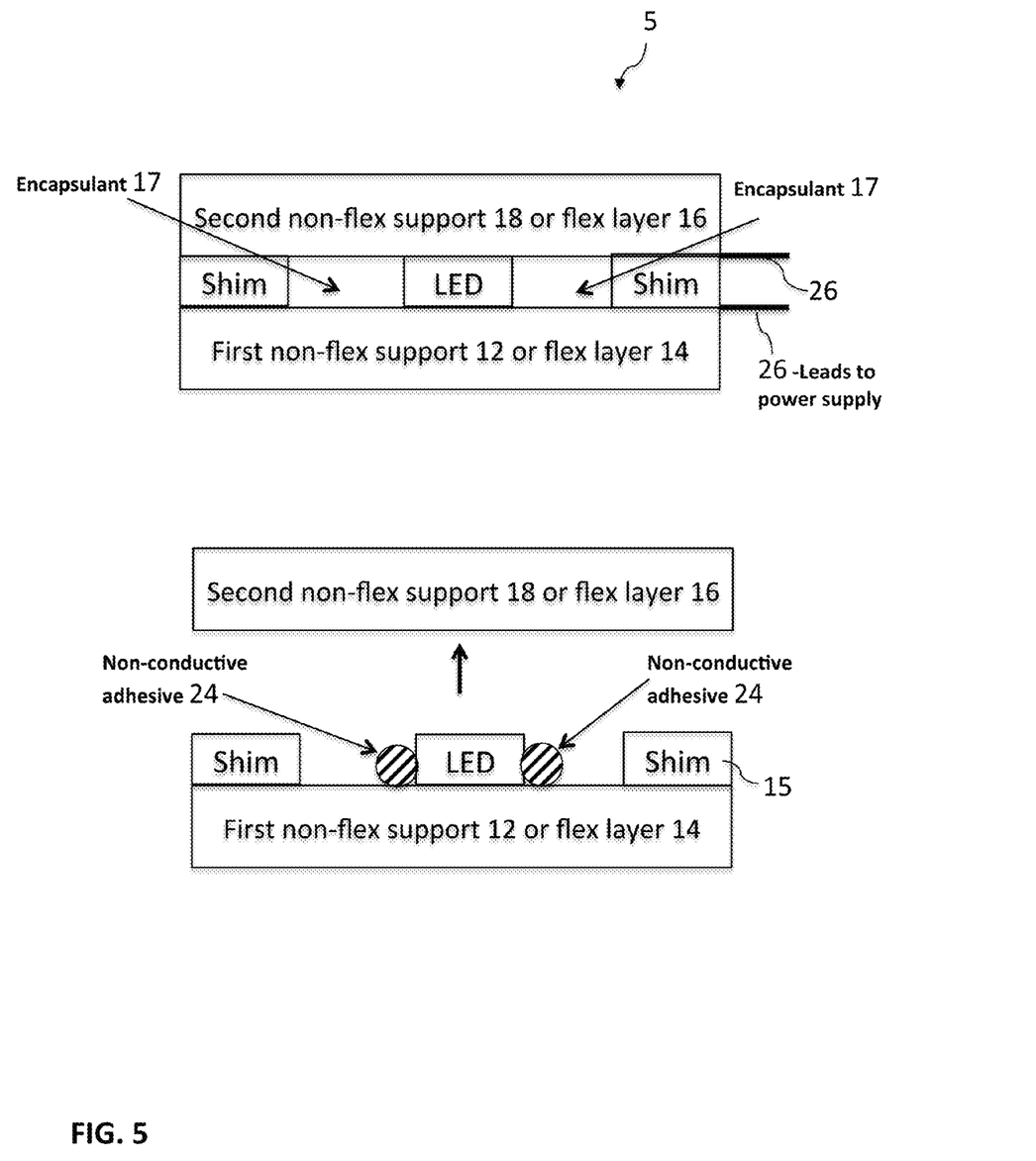
FIG. 5 illustrates a method of fabricating a light-emitting system in accordance with another preferred embodiment of the present invention.

FIG. 5 illustrates another embodiment of the light-emitting system 5 made in accordance with the method of the present invention. The light-emitting device (or an array of light-emitting devices) is placed on a layer that is either a non-flexible support layer 12 or flexible layer 14. The light-emitting device can be optionally attached using non-conductive adhesive 24 as shown in FIG. 5. Then, the shim frame 15 is placed around the perimeter and the top layer that is either a non-flexible support layer 18 or flexible layer 16 is placed on top of the shim frame 15 as shown in FIG. 5. The encapsulant 17 is injected into the cavity formed between the top and bottom layers and then cured. The leads 26 for connecting to power supply can be inserted before curing. The bottom layer (12 or 14) can be transparent, conductive, or transparent and conductive layer (such as ITO). The top layer (16 or 18) includes conductive patterns for forming an electrical circuit in communication with p-contact or n-contact, such that when the top layer is placed, the p-contact or n-contact or both are being in direct contact with the conductive patterns, depending on the orientation of the light-emitting device being used. For example it could be a vertically aligned device, and then only p-contact or n-contact is being in contact with the conductive patterns formed on the top layer.

The non-conductive adhesives for attaching the light-emitting device can be selected from UV-curable or time-curable cyanoacrylates, temperature-curable thermoset adhesives, with typical cure temperature from 60 degrees F. to 180 degrees F., cross-linking thermoset adhesives, temperature-curable or UV-curable silicones, solvent based or polymer adhesives such as emulsion adhesives that harden by drying, pressure sensitive adhesives, contact adhesives, e.g., 3M spray glue tack adhesive, multi part adhesives such as polyols, acrylic polymers, polyester resins, light curing adhesives (UV or sun light activated), elastomers, thermoplastics, emulsions and thermosets such as epoxies, polyurethanes, cyanoacrylates and acrylics, and the like, or mixture thereof.

Figure 6:
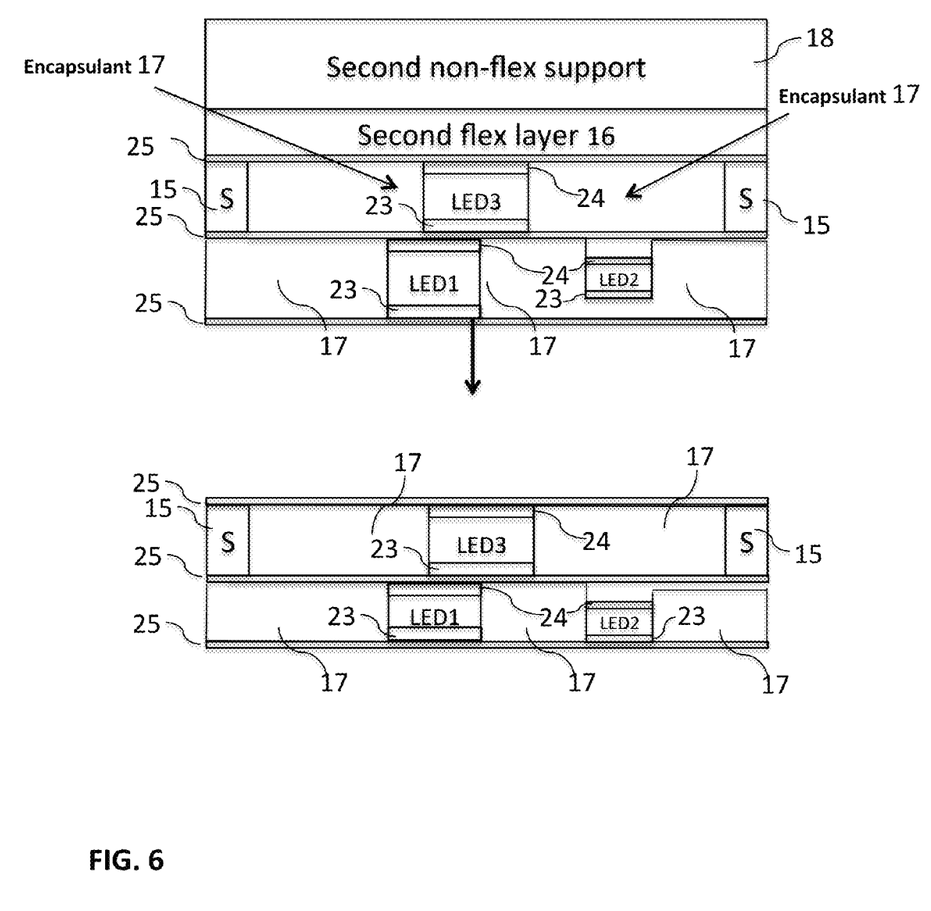
FIG. 6 illustrates a method of fabricating a light-emitting system in accordance with another preferred embodiment of the present invention.

According to the present invention, the light-emitting devices can be stacked vertically as shown in FIG. 6 by repeating encapsulation steps described above and illustrated in FIG. 1. For example, LED3 can be placed on top of an already encapsulated LED1 and LED2. The shim frame 15 is placed on top, followed by the flexible layer 16 and non-flexible support layer 18. The encapsulant 17 is then injected into the cavity and cured. Then top non-flexible layer 18 along with flexible layer 16 and optionally, the shim frame 15 are removed. Using this approach, multiple layers can be built in vertical direction. The non-flexible support layer with protrusions as described above (such as protrusions 20a, 20b shown in FIG. 2) can be used to create via holes for interconnecting the layers and for accommodating light-emitting devices of different height.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A method of making a light-emitting system comprising:
 a) providing at least one light-emitting device comprising a p-doped region, an n-doped region, an active region disposed between the p-doped region and n-doped region, an n-contact layer disposed on the n-doped layer and a p-contact layer disposed on the p-doped layer;
 b) providing a first base support layer;
 c) placing a first additional support layer on the surface of the first base support layer, said first additional support layer being more flexible than the first base support layer;
 d) placing the at least one light-emitting device on the surface of the first additional support layer;
 e) placing a first shim frame on the surface of the first additional support layer;
 wherein the shim height of said first shim frame is about equal to the height of the at least one light-emitting device;
 f) placing a second additional support layer on top of the first shim frame and the at least one light-emitting device such as to form a first cavity between the first additional support layer, the second additional support layer, the at least one light-emitting device, and the first shim frame;
 g) placing a second base support layer on said second additional support layer;
 h) clamping the first and second base support layers with clamps in at least two places around the perimeter of said first and second base support layers;
 i) injecting an encapsulant material into the first cavity such as to form a first encapsulant material layer;
 j) curing the encapsulant material of the first encapsulant material layer;
 k) removing the clamps;
 l) removing the second base support layer;
 m) removing the second additional support layer;
 n) removing the first additional support layer;
 (p) forming conductive patterns on the first encapsulant material layer, the patterns forming a first circuit configured to connect to a power source for the at least one light-emitting device, said first circuit comprising electrical communication with the n-contact layer and the p-contact layer of the light-emitting device;

(q) placing at least one additional light-emitting device and a second shim frame on the surface of the cured encapsulant material layer, wherein the height of the second shim is about equal to the height of the at least one additional light-emitting device, and wherein the at least one additional light-emitting device comprises a second p-doped region, a second n-doped region, a second active region between the second p-doped region and the second n-doped region, a second n-contact layer disposed on the second n-doped region and a second p-contact layer disposed on the second p-doped region;

(r) placing a third additional support layer on top of the second shim frame and the at least one additional light-emitting device such as to form a second cavity between the third additional support layer, the cured encapsulant material layer, the at least one additional light-emitting device, and the second shim frame;

(s) placing a third base support layer on said third additional support layer;

(t) clamping the first and third base support layers with clamps in at least two places around the perimeter of said first and third base support layers;

(u) injecting a second encapsulant material into the second cavity such as to form a second encapsulant material layer;

(v) curing the second encapsulant material;

(w) removing the first base support layer, the third base support layer and the third additional support layer; and (y) forming second conductive patterns on the second encapsulant material layer, the second patterns forming a second circuit configured to connect to a power source the at least one additional light-emitting device, said second circuit comprising electrical communication with the second n-contact layer and the second p-contact layer of the at least one additional light-emitting device;

wherein the at least one light-emitting device and the at least one additional light-emitting device are selected from the group consisting of a light emitting diode, a surface mount device package incorporating at least one light-emitting diode, an integrated circuit incorporating at least one light-emitting diode, or a combination thereof.

2. A method according to claim 1, wherein the p-contact layer and the n-contact layer are disposed on the same side of the light-emitting device, on the side that is opposite a light emission surface of the light-emitting device.

3. The method according to claim 1, wherein the first p-contact layer and the first n-contact layer are disposed on opposite sides of the at least one light-emitting device, and the second p-contact layer and the second n-contact layer are disposed on opposite sides of the additional at least one light-emitting device.

4. The method according to claim 1, further comprising disposing a light converting phosphor layer.

5. The method according to claim 1 wherein at least one of the first and second base support layers have at least one protrusion having a height about equal to the height of the at least one light-emitting device.

6. The method according to claim 1 wherein at least one of the first and second base support layers have at least one protrusion with a height that is not equal to the height of the at least one light emitting device.

7. The method according to claim 1, wherein the first and second base support layers each have at least one recess, the recess of the first base support layer and the recess of the second base support layer aligning with each other and forming an opening.

8. The method according to claim 1, wherein the first shim frame has at least one discontinuity.

9. The method according to claim 1, wherein the second shim frame is conductive, and wherein the method further comprises electrically connecting the conductive patterns formed on the second encapsulant material layer to the second shim frame.

10. The method according to claim 1, further comprising removing the first shim frame.

11. The method according to claim 1, further comprising removing the second shim frame.

12. The method according to claim 1, wherein the first shim frame is conductive, and wherein the method further comprises connecting the conductive patterns formed on the first encapsulant material layer to the first shim frame.

* * * * *